United States Patent [19]

Hirahata et al.

[11] 4,417,318

[45] Nov. 22, 1983

[54] ARRANGEMENT FOR CONTROL OF THE OPERATION OF A RANDOM ACCESS MEMORY IN A DATA PROCESSING SYSTEM

[75] Inventors: Shigeru Hirahata; Teruhiro Takezawa, both of Yokohama; Nobuo Onuki, Ebina; Shigeru Komatsu; Tsuguji Tachiuchi, both of Yokohama, all of Japan

[73] Assignee: Hitachi, Ltd., Tokyo, Japan

[21] Appl. No.: 35,237

[22] Filed: May 2, 1979

[30] Foreign Application Priority Data

May 4, 1978 [JP] Japan .................................. 53-53491

[51] Int. Cl.[3] .......................... G06F 3/00; G11C 11/34

[52] U.S. Cl. .................................................... 364/900

[58] Field of Search ... 364/200 MS File, 900 MS File

[56] References Cited

U.S. PATENT DOCUMENTS 3,971,000 7/1976 Cromwell ............................ 364/200
4,028,675 6/1977 Frankenberg ........................ 364/900
4,084,154 4/1978 Panigrahi ............................ 365/222

OTHER PUBLICATIONS

Heathkit Manual for the Video Terminal H-19; Heath Company, Benton Harbor, Michigan, ©Jan. 1979.

*Primary Examiner*—Gareth D. Shaw
*Assistant Examiner*—John G. Mills
*Attorney, Agent, or Firm*—Antonelli, Terry & Wands

[57] ABSTRACT

A data processing system has a dynamic type memory, a static type memory for storing data periodically read out, a central processing unit for transferring data to and from the two memories, an address generating circuit for periodically applying an address to the static type memory to read out the contents thereof, and an address selecting unit for exclusively selecting an address from the central processing unit or an address from the address generating circuit. In the system, the two memories are connected to the address selecting unit in order that the address selected by the address selecting means is supplied common to both the memories.

8 Claims, 6 Drawing Figures

ARRANGEMENT FOR CONTROL OF THE OPERATION OF A RANDOM ACCESS MEMORY IN A DATA PROCESSING SYSTEM

BACKGROUND OF THE INVENTION

The invention relates to an address supply unit for a memory and, more particularly, to an address supply unit for a memory to be refreshed and a memory storing data to be periodically read out.

A memory which is widely used and which requires refreshing is a dynamic type RAM (random access memory) which is refreshed in the manner as described in "Memory Design Handbook" published in 1977 by Intel Corporation, pp. 2-4 to 2-8, for example.

A memory for storing data to be periodically read out is generally used to store displaying data in a character/symbol display unit. A cycle steal method is generally used to periodically read out data from such a memory, to write data into that memory, or to rewrite the contents of the memory. The cycle steal method is disclosed in "Transistor Technology" (which is a monthly published magazine) published on May, 1977, pp. 215 to 217.

In recent years, rapid progress in LSI (large scale integration) technology has produced a microcomputer in which a central processing unit is formed by a single LSI chip. With the advent of the microcomputer, a system using mainly a CPU has gradually superseded the conventional general digital IC system. Such a system has as major components a CPU, a memory circuit of the read-only type (referred to as a program ROM) for storing the processing programs of the CPU, a memory circuit which is rewritable (referred to as a data RAM) and which temporarlly stores data in the course of the system operation, and an input/output circuit.

When such a system is utilized for a character/symbol display unit, what is first taken into consideration is what type of memory must be used for the data RAM and for the display RAM for storing character/symbol data to be displayed on the screen of a display unit. Generally, the static type RAM is relatively expensive and has a large power consumption and hence is unsuitable for a case requiring a large memory capacity. However, it requires no refreshing operation and thus no additional circuit for refreshing. For this reason, the static type RAM is used for the case where only a small memory capacity is required. On the other hand, the dynamic RAM is suitable for an inexpensive memory of large memory capacity, but the stored information volatilizes with a given lapse of time. Therefore, the dynamic type RAM must be refreshed at given time intervals (2 msec) so that it needs a circuit to generate an address or a refresh request signal for refreshing and a refresh control signal to control the cycle timing of the read and write operation of data in the dynamic RAM with the refreshing operation, and a multiplexer for selecting either an address for refreshing or an address for a read and write operation in accordance with the cycle timing.

The static type RAM and the dynamic type RAM respectively have advantages and disadvantages, as described above, so that those RAMs must be selected in compliance with the requirements of a particular system. When microcomputer system is utilized for the character/symbol display unit, the RAM used as the data RAM must have a relatively large memory capacity since, the amount of data to be stored in the data RAM is great and the memory capacity must be provided with some superfluous capacity. For this, from the point of view of economy, the dynamic type RAM is most suited for use as the data RAM in the character/symbol display unit since the dynamic type RAM is an inexpensive memory of large capacity. On the other hand, a display RAM needs a memory capacity merely corresponding to the display screen in one-to-one relation. Accordingly, the static type RAM is suitable for use as the display RAM. Thus, in the conventional character/symbol display units, in general, the dynamic type RAM is used as the data RAM and the static RAM is used as the display RAM in order to provide inexpensive memory units. Of course, it is also known to use a dynamic RAM as the display RAM. When the dynamic type RAM is used for the data RAM and the static type RAM for the display RAM, there is a need for a refresh control circuit to refresh the data RAM and a multiplexer, and for supplying a signal to hold data within the data RAM so that it is not outputted onto the data bus and to prohibit the CPU from making access to the data RAM. Accordingly, during the refreshing operation, the CPU must stop its data processing operation so that the processing speed of the CPU is reduced. On the other hand, since the display RAM is read out by the cycle steal system, it is provided with a multiplexer for periodically selecting an address for periodic read-out and an address for write or erase delivered from the CPU.

In such a microcomputer system with the static type RAM storing data to sequentially and periodically be read out and the dynamic type RAM requiring the refresh operation, such as a character/symbol display unit, many additional circuits are required. As a result, the system is expensive and the system control is complicated and the processing speed of the CPU is reduced.

SUMMARY OF THE INVENTION

Accordingly, an object of the present invention is to provide an address supply unit for a memory with a simple circuit construction which is used in a computer system with a memory requiring refreshing at fixed time intervals and a memory storing data to sequentially and periodically be read out.

Another object of the invention is to provide an address supply unit for a memory with improved processing speed which is used in a computer system with a memory requiring the refresh operation at fixed time intervals and a memory storing data to sequentially and periodically be read out.

The address supply unit according to the invention supplies the same address to the memory requiring the refreshing and the memory requiring the sequential and periodic data read-out, employs the same read-out period as the refresh period, and performs the read-out and the refresh operations within the same period of time. The period between the adjacent read-out and refreshing periods is used to interchange data in the CPU with data in one of the memories.

DESCRIPTION OF THE PREFERRED EMBODIMENTS

Figure 1:
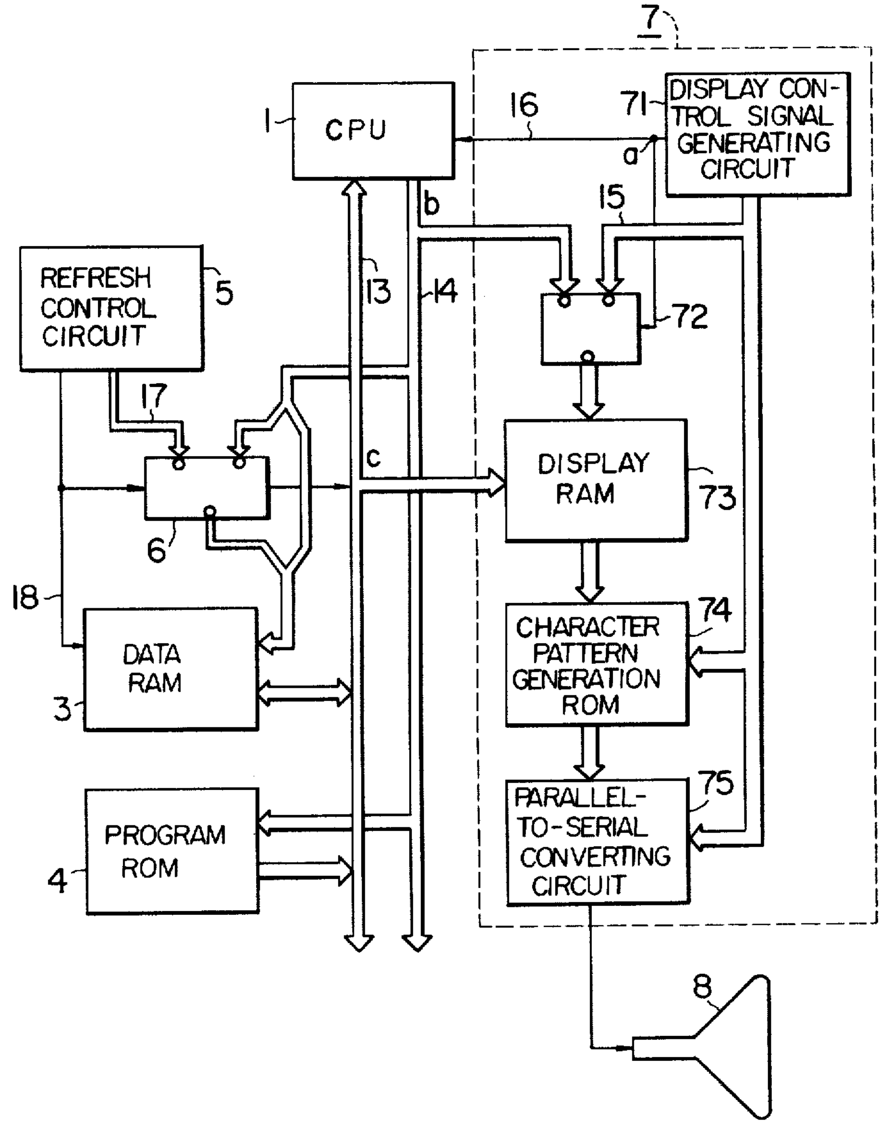
FIG. 1 shows a block diagram of an address supply unit for a memory when it is combined with the prior art to form a character/symbol display unit to aid in understanding the objects, features and effects of the present invention.

For a better understanding of the objects, features and effects of the present invention, reference will be made to FIG. 1 illustrating a computer system which includes the combination of a dynamic RAM to be used as a data RAM having a circuit to control the refreshing operation and a static RAM for display requiring the sequential and periodic read-out operation, as applied to a character/symbol display unit. Thus, FIG. 1 shows a block diagram of a system which exemplifies the disadvantages which the present invention seeks to overcome and with respect to which the present invention represents an improvement. In FIG. 1, reference numeral 1 designates a CPU; 3 a data RAM; 4 a program ROM; 5 a refresh control circuit for effecting the refresh operation independently of the read/write operation for the CPU 1 in order that the contents of the data RAM is not volatilized; 6 a multiplexer for periodically supplying an address to be refreshed to the data RAM 3 for the purpose of its refreshing operation; 7 a character/symbol display circuit for enabling the character/symbol information to be displayed; 8 a display device such as a cathode ray tube. Reference numeral 13 denotes a data bus, for data transfer between the CPU 1 and related circuits; 14 an address bus for the CPU 1 to supply an address signal to related circuits; 17 a signal path to supply a refresh address signal generated by the refresh control circuit 5 to the multiplexer 6; 18 a signal path to supply a refresh request signal generated by the refresh control circuit 5.

The character/symbol display circuit 7 is comprised of a display control signal generating circuit 71 to generate a synchronizing signal for a television signal and an address signal for display, a multiplexer 72 to interchange the address bus 14 with a signal path 15 connecting to the circuit 71 in response to a clock signal a supplied through a signal path 16 from the circuit 71; a memory circuit 73 (referred to as a display RAM) for storing the character/symbol information at the memory locations corresponding to specified locations on a display screen; a memory circuit 74 (referred to as a ROM for character pattern generation of the read only type for previously storing the character/symbol patterns corresponding to the character/symbol information, and a parallel-to-serial converting circuit 75 for converting a parallel signal derived from the character pattern generator ROM 74 into a serial signal. In an actual display unit, the character display circuit 7, which corresponds to an output circuit of the CPU 1, is generally coupled with an input circuit such as a key board, through the data bus 13 and the address bus 14. This, however, is not essential to the invention, so that no further elaboration will be given with respect thereto.

Figure 2:
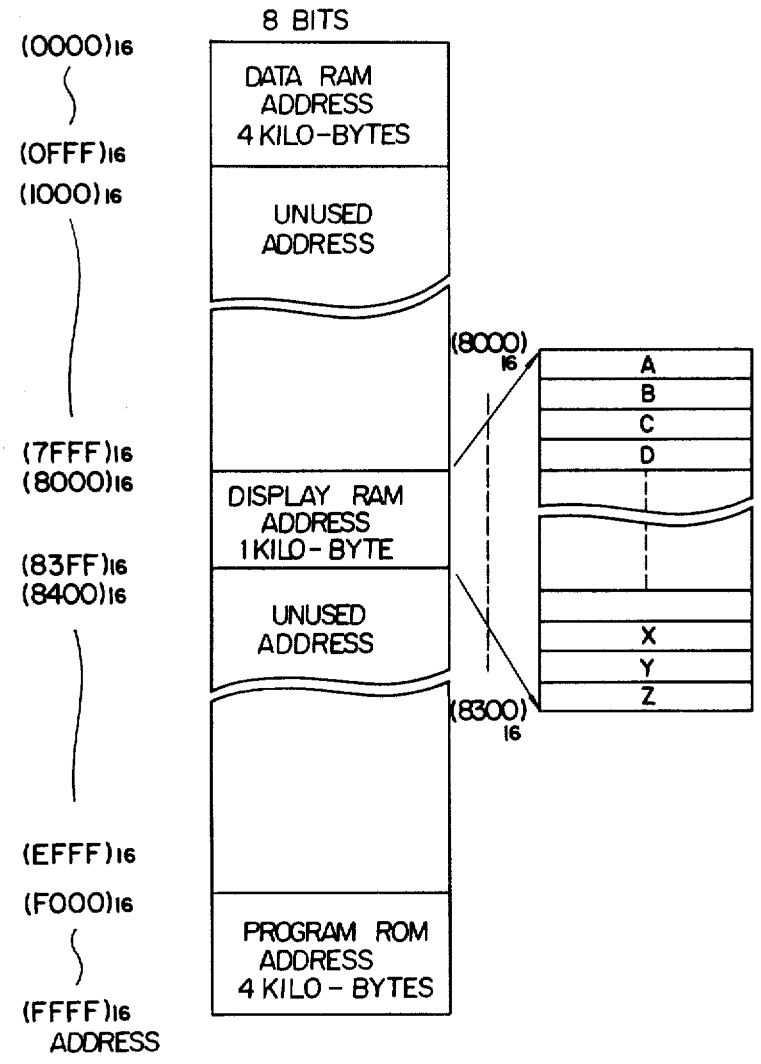
FIG. 2 diagramatically illustrates an assignment of addresses in a memory used in the unit according to the invention.

The operation of the CPU 1 will first be given. In general, the CPU 1 is capable of simultaneously processing data of a plurality of bits. In this example, however, it is assumed for ease of explanation that CPU 1 can process data bytes of 8 bits in parallel fashion. Accordingly, the data bus 13 includes 8 parallel lines through which data transfer is performed between the CPU 1 and the program ROM 4, the data RAM 3 and the display RAM 73. Assuming that the address bus has 16 parallel lines the CPU 1 can produce address signals ranging from an address 0 to an address 65535 ($=2^{16}-1$). In this case, if 4 bits are assigned to 1 digit, it may be expressed by a hexadecimal number, 0, 1, 2, . . . 8, 9, A(10), B(11), . . . F(15). In general, the microcomputer system couples the CPU 1 to the respective related circuits by means of the same address bus 14 and the same data bus 13, as shown in FIG. 1. It is for this reason that, in order to separate the circuits, the addresses assigned to the circuits are different from one another. An example of the address assignments to the circuits is illustrated in FIG. 2. In FIG. 2, the total of 4096 addresses from an address $(F000)_{16}$ to an address $(FFFF)_{16}$ are assigned to a program ROM 4 $(F000)_{16}$; the total of 4096 addresses from an address $(0000)_{16}$ to an address $(0FFF)_{16}$ to a data RAM 3; the total of 1024 addresses from $(8000)_{16}$ to $(83FF)_{16}$ to a RAM 73 for display.

As is known, the microcomputer is of the program store type like the conventional electronic computer. Accordingly, a processing procedure (program) to operate the system in FIG. 1 is stored in the program ROM 4. As shown in FIG. 2, the program ROM 4 occupies 4096 addresses from addresses $(F000)_{16}$ to $(FFFF)_{16}$ and in response to an address information carried by the address bus 14 from the CPU 1, it produces the contents specified by the address information onto the data bus 13 which in turn is loaded into the CPU 1 where it is decoded into an instruction for operating the system. More specifically, the CPU 1 is generally provided therein with a program counter of which a value produced specifies the address of the program ROM 4 storing the instruction currently being executed.

Figure 4:
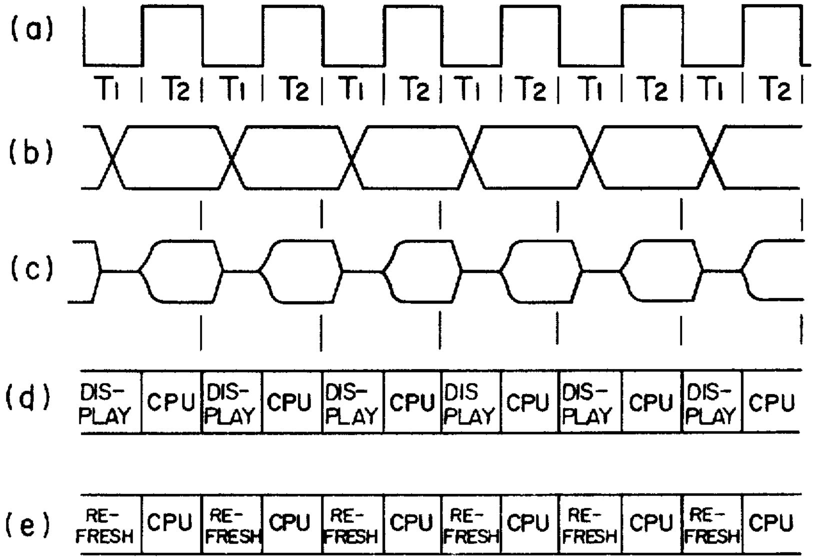
FIG. 4 shows a set of wave forms of signals at major portions of the address supply unit according to the invention.

Then, the address is outputted onto the address bus 14 and the data stored in the address of the program ROM 4 is applied through the data bus 13 to the CPU. CPU 1 decodes the data into an instruction which in turn changes the contents of the data RAM 3 or the display RAM 73 and transfers data to and from the related input and output circuits, for the purpose of the whole system operation. The relation between clock signals and signals on the address bus and the data bus is illustrated in FIG. 4. FIG. 4(*a*) shows clock signals supplied through the signal path 16 to the CPU 1; FIG. 4(*b*) signals in HIGH and LOW levels on the respective lines of the address line 14; FIG. 4(*c*) a data signal on the respective lines of the data bus 13. Onto the address bus 14, the CPU 1 unidirectionally produces a signal which renews an address within a pregiven period T1, although the address signal delays by a given time due to a transient phenomenon incident to the falling of a clock pulse. The data from the CPU 1 and the data from RAM 3 or ROM 4 are supplied onto the data bus 13. Therefore, the system is so designed that the data is produced only for a period T2 so as to avoid the coexistence of different data derived from different sources on the data bus 13. As seen from FIGS. 4(*a*) to (*c*), at the trailing edge of the clock signal, the data signal as well as the address signal are in a steady state. Accordingly, the data loading is performed at this time point of the trailing edge.

Figure 3:
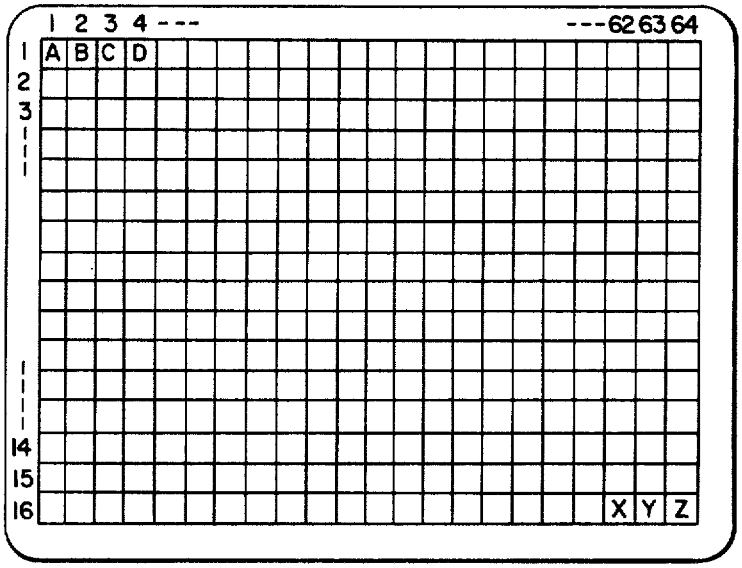
FIG. 3 illustrates display segments on the screen of a character/symbol display unit.
Figure 5:
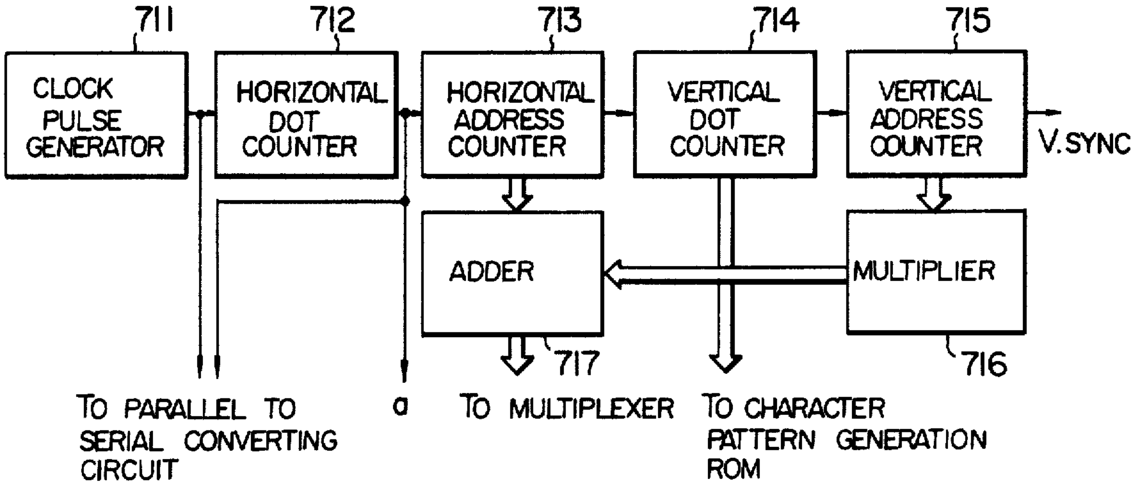
FIG. 5 shows a block diagram of a major portion of the address supply unit according to the invention.

The description mentioned above relates to the general operation of the CPU 1. The explanation to follow is the elaboration of the character/symbol display circuit 7 for displaying on the display device 8 the character/symbol information loaded into the CPU 1. This circuit is known as a cycle steal display system. The feature of this system resides in a stable display of characters and symbols without the need for a special processing in that the CPU 1 makes access to the display RAM 73 only for the horizontal flyback period. Specifically, in the light of the fact that the data from CPU 1 is transferred only for the period T2, as shown in FIG. 4, the CPU 1 and the display RAM 73 are separated by the multiplexer 72 during the period T2 and a display address signal from the display control signal generating circuit 71 is supplied to the display RAM 73 through the multiplexer 72 to read out the character/symbol information stored therein. An address signal supplied to the display RAM 73 at this time is illustrated in FIG. 4(*d*). Character or symbol information read out is supplied to the ROM 74 for character/symbol pattern generation which has previously stored character and symbol patterns, as in the other display system. Then, a signal from the display control signal generating circuit 71 reads out the one line information of one character or symbol pattern. The information read out is supplied to the parallel-to-serial converting circuit 75 which in turn produces sequentially an output signal dot by dot to the display device 8. An example of an image thus displayed on the display device 8 is illustrated in FIG. 3. The screen of the display device in this example is capable of displaying the total of 1024 character or symbol patterns, with 64 patterns for horizontal and 16 patterns for vertical. Further, the character and symbol pattern information on the viewer screen respectively correspond to the character and symbol information stored in the display RAM 73 having 1024 addresses from addresses $(8000)_{16}$ to $(83FF)_{16}$ shown in FIG. 2. The circuit construction of the display control signal generating circuit 71 is illustrated in FIG. 5. In FIG. 5, a clock signal generator 711 produces clock pulses with fixed periods coincident with the read-out periods of the individual picture elements when the viewer screen is horizontally scanned. For this reason, the clock pulse is used as a pulse for reading out horizontal dots of the parallel-to-serial converting circuit 75. If a character or symbol is formed by 8 dots arranged in the horizontal direction, a horizontal dot counter 712 produces pulses with periods each of which permits 8 clock pulses to be counted. The pulse inverts the polarity every four counts and corresponds to the clock signal shown in FIG. 4(*a*). The clock signal is applied to the parallel-to-serial converting circuit 75 in order that a signal from the character pattern generating ROM 74 is loaded, at the trailing edge, into a shift register included in the parallel-to-serial circuit 75. The clock signal also is applied to a horizontal address counter 713. The address counter 713 produces a horizontal synchronizing pulse with a period corresponding to the period permitting the counting of 82 clock pulses which is the sum of the number 64 (see FIG. 3) of characters or symbols in one line and the count number 18 corresponding to the horizontal flyback period. If the number of scanning lines forming one line is 12, a vertical dot counter 714 produces pulses with periods each corresponding to a period for counting 12 horizontal synchronizing pulses and then applies them to a vertical address counter 715. Since the contents of the vertical dot counter 714 represents a vertical position in each line so that it is applied to the character pattern generating circuit ROM 74 to make an access to one line of a character matrix read out. A vertical address counter 715 counts the output pulses of the vertical dot counter 714 by 20 which is the sum of the number 16 (see FIG. 3) of lines constituting a character to be displayed and the count number 4 corresponding to the vertical flyback period. At this time, the counter 715 produces vertical synchronizing pulses. A multiplier 716 multiplies a count value of the vertical address counter 715 with the number 64 of displaying characters in one line and supplies the result of the multiplication to an adder 717. The adder 717 adds the count value from the horizontal address counter 713 to the output signal from the multiplier 716 thereby to form addresses for the display RAM 73. Therefore, the addresses for the display RAM 73 occupies the memory area ranging from $(8000)_{16}$ to $(83FF)_{16}$, as shown in FIG. 2 and the addresses are sequentially and repeatedly read out by the adder 717.

The refreshing operation follows. When any one item of data stored in the data RAM 3 is refreshed, all the data in the line having the data per se is refreshed. Therefore, the addresses for only one line suffice for the addresses for the refreshing. The data RAM is refreshed one time when a refresh request signal is applied following the application of the refreshing address. The refresh control circuit 5 produces a refresh request signal to the signal path 18 every fixed period and also produces a refresh address to the signal path 17. Several lower digit lines of the address bus 14 corresponding to the signal path 17 are connected to the multiplexer 6. The data RAM 3 is so designed that, even if any signal exists on the upper digit line, the row to be refreshed is determined by only the lower digit address. The refresh request signal takes a wave form as shown in FIG. 4(*a*) and connects the multiplexer 6 to the signal path 17 when it is LOW in level. During this time, a refresh address is outputted onto the signal path 17. The refresh is performed at the leading edge of the refresh request signal. So long as the refresh request signal is HIGH in level, the multiplexer is connected to the address bus 14 side, to permit data transfer between CPU 1 and the data RAM 3. When the multiplexer 6 is connected to the signal path 17, its state is transferred to CPU 1 through the data bus 13 to prohibit the CPU 1 from making an access to the data RAM 3. As a result, the processing speed of the CPU 1 is substantially reduced.

Figure 6:
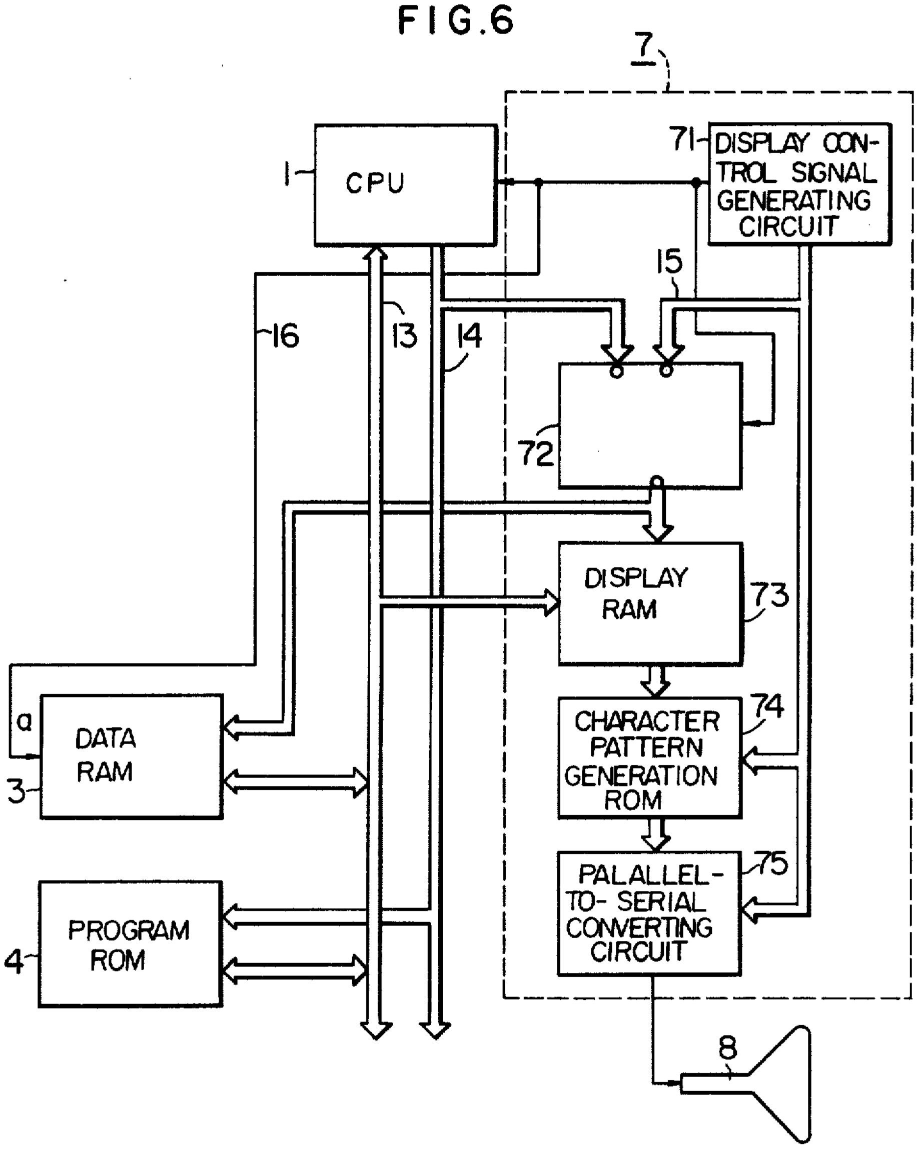
FIG. 6 shows a block diagram of an embodiment of the address supply unit according to the invention.

The invention will be described in detail by using an embodiment shown in FIG. 6. In FIG. 6, like numerals are used to designate like portions or equivalent portions in FIG. 1. In FIG. 6, there is supplied to the data RAM 3 an address signal which is the same as the address signal supplied to the display RAM 73 and a refresh control signal for the RAM 3 is the same as a switch signal supplied to the multiplexer 72. In other words, the address signal from the CPU 1 and the display address supplied from the display control signal generating circuit 71 are alternately applied to the data RAM 3. As shown in FIG. 4(*e*), during the display period of the display RAM 73, the data RAM 3 refreshes while, during the remaining period, the CPU 1 executes data processing operations. During one CPU period, one data item is accessed and, during the first CPU period after the CPU 1 processed the one data item loaded thereinto, the next data is accessed during the next CPU period.

The data RAM 3 occupies the addresses $(0000)_{16}$ to $(0FFF)_{16}$ and the display RAM 73 the addresses $(8000)_{16}$ to $(83FF)_{16}$. Accordingly, the hexadecimal lower three digits of the adder 717 of the display control signal generating circuit 71 corresponds to the addresses $(0000)_{16}$ to $(03FF)_{16}$ of the data RAM 3. Therefore, the address derived from the adder 717 may be used as a refresh address of the data RAM 3.

The maximum memory capacity of the dynamic RAM of those currently commercially available is 16 kilo-bits (128×128) and the maximum refresh period thereof is 2 ms. Accordingly, if, within the period of time, all the 128 continuous addresses are accessed, the contents of the memory are all refreshed. The reason why the dynamic RAM of 16 kilo-bits is used is that, as the capacity increases, the addresses to be accessed within the maximum refresh period increases in number. Accordingly, if the condition of the dynamic RAM is satisfied, the refreshing operation of the RAM with smaller memory capacity may be performed without any trouble. For example, in the dynamic RAM of 4 kilo-bits, the data included in one line is refreshed 64 times within 2 ms. The refresh period when 128 different addresses are accessed is given by the equation (1)

$$T_{REF}=128/N\times T_H\times(C_Y+1) \quad (1)$$

where $T_{REF}$: Refresh period (s)

N: Number of displaying characters per line $T_H$: One scanning horizontal period (μs)

$C_Y$: Number of one scanning lines necessary for displaying one line (one character)

The term $(C_Y+1)$ in the equation (1) will be described. In order to display a character on one line of screen, data in the addresses 1 to 64 is repeatedly read out over $C_Y$ (12) times. Accordingly, the rows corresponding to them are refreshed but the data in the addresses 65 to 128 are not yet refreshed. When the vertical dot counter 714 is counted by 12, the multiplexer 716 produces "64" so that, at this time, the adder 717 starts to produce the addresses from 65 to 128. Accordingly, all the contents of the data RAM 3 may be fully refreshed by horizontal scanning lines of at least $(C_Y+1)$.

Let us calculate the refresh period when the display device 8 in the example of the prior art is a cathode ray tube and display is made as shown in FIG. 3. As seen from FIG. 3, N is 64 and $C_Y$ is 12 and $T_{REF}$ is given by the equation (2)

$$T_{REF}=128/64\times 63.5\times(12+1)=1651\ (\mu s) \quad (2)$$

Thus, the refresh period is less than the maximum one (2 ms) so that the contents of the data RAM does not disappear and the construction of the present invention is effectively operable. The case is also permissible for a $C_Y$ of 8. The example mentioned above relates to the case where the cycle steal display system is applied for the display circuit. An alternation is permissible where the multiplexer 72 is switched only when the CPU 1 makes an access to the data RAM 3 and the display RAM 73.

The application of the present invention is not limited to the character display unit as mentioned above. The present invention is applicable for a graphic display for directly displaying the contents of the display RAM on the display device. In this case, the ROM 74 for the character/symbol pattern generation within the display circuit 7 is omitted.

When the display RAM 73 is used only for storing the data to be displayed on the screen, the memory area of 1024 (64×16) suffices. Accordingly, if the static type RAM of 16 kilo-bits (64×64) is used, a great amount of memory area is not used. Therefore, the unused area may be used for the same purpose as that of the data RAM 3 and the data transfer with the CPU may be made in the CPU period in FIGS. 4(*d*) and (*e*), in exactly the same manner as that mentioned previously.

As described above, the display control signal generating circuit 71 and the multiplexer 72 for the display RAM 73 are involved in the refresh circuit of the data RAM 3. Accordingly, the circuit construction is simple and the cost of the system is inexpensive. Additionally, although the dynamic RAM is used for the data RAM, the refresh time is included in the time necessary for the display, with the result that the reduction of the processing time of the CPU is avoided.

We claim:

1. In a data processing system including a first memory to be refreshed; a second memory for storing data to be successively read out during first periodic cycles; and a central processing unit for effecting transfer of data to and from said first and second memories during second periodic cycles which alternate with said first periodic cycles; the improvement comprising display control address generating means for producing addresses sequentially during said first periodic cycles to periodically read out the contents of said second memory;

address selecting means which alternately and exclusively selects an address derived from said central processing unit or an address derived from said display control address generating means during said first and second periodic cycles and supplies the selected address in common to said first and second memories whereby, when said address selecting means selects an address from said central processing unit, said central processing unit executes a data transfer to one of said first and second memories, and when said address selecting means selects the address from display control address generating means, said first memory is refreshed and said second memory reads out stored data; and control signal generating means responsive to said display control address generating means generating an address for producing a control signal to cause said address selecting means to perform said selection operation in synchronism with the address generation of said display control address generating means.

2. A data processing system according to claim 1, wherein the period with which said address generating means sequentially produces an display control address is the same as that for said control signal generating means to produce said control signal.

3. A data processing system according to claim 2, wherein said first memory is refreshed when said address selecting means selects said display control address generating means in response to said control signal.

4. A data processing system according to claims 1, 2 or 3, wherein when said address selecting means selects said central processing unit, said central processing unit interchanges data with said first memory or second memory and, in a situation that the next data interchange is to be performed, when said address selecting means first selects on said central processing unit side, the next data interchange is performed.

5. A data processing system according to claim 1, wherein said second memory includes a storage area which is not subjected to the periodic read-out operation and used as a data memory.

6. A data processing system according to claim 1, wherein said address selecting means is a multiplexer.

7. A data processing system according to claim 1, wherein the period with which said display control address generating means sequentially produces an address is the same as that for said control signal generating means to produce said control signal.

8. A data processing system according to claim 1, wherein said address selecting means is a multiplexer.

* * * * *